(12) United States Patent
Kreuzer

(10) Patent No.: US 7,031,077 B2
(45) Date of Patent: Apr. 18, 2006

(54) OPTICAL REDUCTION METHOD WITH ELIMINATION OF RETICLE DIFFRACTION INDUCED BIAS

(75) Inventor: Justin L. Kreuzer, Trumbull, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 10/982,870

(22) Filed: Nov. 8, 2004

(65) Prior Publication Data

US 2005/0094289 A1   May 5, 2005

Related U.S. Application Data

(63) Continuation of application No. 10/366,614, filed on Feb. 14, 2003, now Pat. No. 6,836,380, which is a continuation of application No. 09/841,166, filed on Apr. 25, 2001, now Pat. No. 6,522,483.

(60) Provisional application No. 60/199,392, filed on Apr. 25, 2000.

(51) Int. Cl.
*G02B 17/00* (2006.01)
*G02B 27/28* (2006.01)

(52) U.S. Cl. ........................ 359/727; 359/726; 359/483; 359/485; 359/494; 359/497; 359/499

(58) Field of Classification Search ............... 359/726, 359/727, 728, 483, 485, 489, 494, 495, 497, 359/499, 631, 636, 639
See application file for complete search history.

(56) References Cited

U.S. PATENT DOCUMENTS

| | | | |
|---|---|---|---|
| 4,953,960 A | 9/1990 | Williamson | 359/663 |
| 5,442,184 A | 8/1995 | Palmer et al. | 250/442.2 |
| 5,537,260 A | 7/1996 | Williamson | 359/727 |
| 5,539,567 A * | 7/1996 | Lin et al. | 359/281 |
| 5,539,568 A * | 7/1996 | Lin et al. | 359/285 |
| 6,081,382 A | 6/2000 | Omura | 359/629 |

(Continued)

FOREIGN PATENT DOCUMENTS

EP    0 823 662 A2    2/1998

OTHER PUBLICATIONS

D. G. Flagello and A.E. Rosenbluth, "Lithographic Tolerances Based on Vector Diffraction Theory," J. Vac. Sci. Technol. B 10(5), Nov./Dec. 1992, pp. 2997-3003.

(Continued)

*Primary Examiner*—Loha Ben
(74) *Attorney, Agent, or Firm*—Sterne, Kessler, Goldstein & Fox, P.L.L.C.

(57) ABSTRACT

An optical reduction system for use in the photolithographic manufacture of semiconductor devices having one or more quarter-wave plates operating near the long conjugate end. A quarter-wave plate after the reticle provides linearly polarized light at or near the beamsplitter. A quarter-wave plate before the reticle provides circularly polarized or generally unpolarized light at or near the reticle. Additional quarter-wave plates are used to further reduce transmission loss and asymmetries from feature orientation. The optical reduction system provides a relatively high numerical aperture of 0.7 capable of patterning features smaller than 0.25 microns over a 26 mm×5 mm field. The optical reduction system is thereby well adapted to a step and scan microlithographic exposure tool as used in semiconductor manufacturing. Several other embodiments combine elements of different refracting power to widen the spectral bandwidth which can be achieved.

7 Claims, 10 Drawing Sheets

U.S. PATENT DOCUMENTS

| | | | |
|---|---|---|---|
| 6,157,498 A | 12/2000 | Takahashi | 355/53 |
| 6,208,473 B1 | 3/2001 | Omura | 359/727 |
| 6,229,647 B1 | 5/2001 | Takahashi et al. | 359/487 |
| 6,362,926 B1 | 3/2002 | Omura et al. | 359/727 |
| 6,392,800 B1 * | 5/2002 | Schuster | 359/485 |
| 6,522,483 B1 * | 2/2003 | Kreuzer | 359/727 |
| 6,680,798 B1 * | 1/2004 | Kreuzer | 359/499 |
| 6,836,380 B1 * | 12/2004 | Kreuzer | 359/727 |

OTHER PUBLICATIONS

D.G. Flagello et al., "Understanding High Numerical Aperture Optical Lithography," Microelectronic Engineering 17, 1992, pp. 105-108.

Copy of International Search Report Application No. PCT/US01/13139, issued Sep. 21, 2001, 4 pages.

* cited by examiner (CONVENTIONAL REDUCTION SYSTEM)

DIFFRACTION INDUCED BIAS EFFECTS

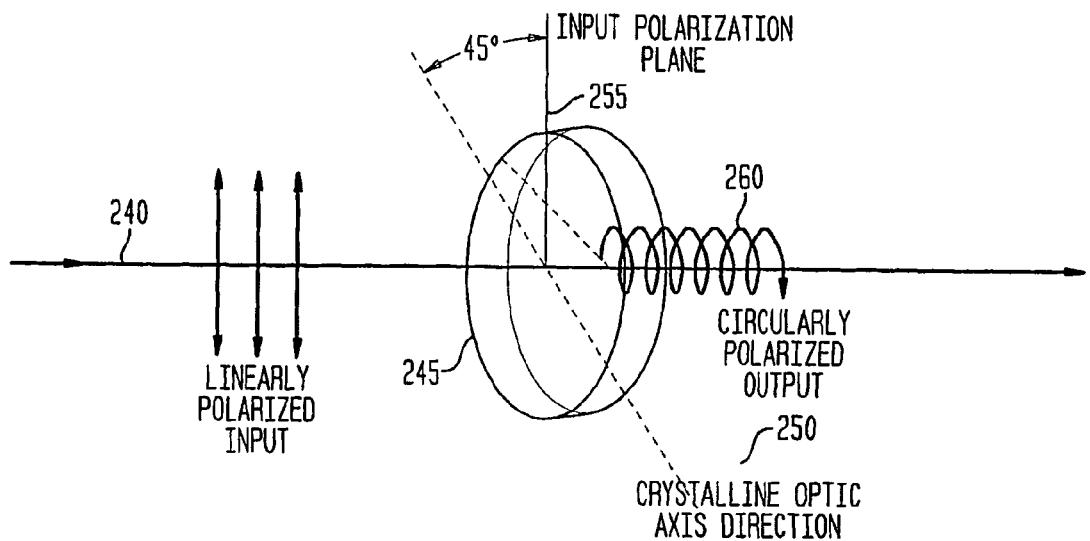
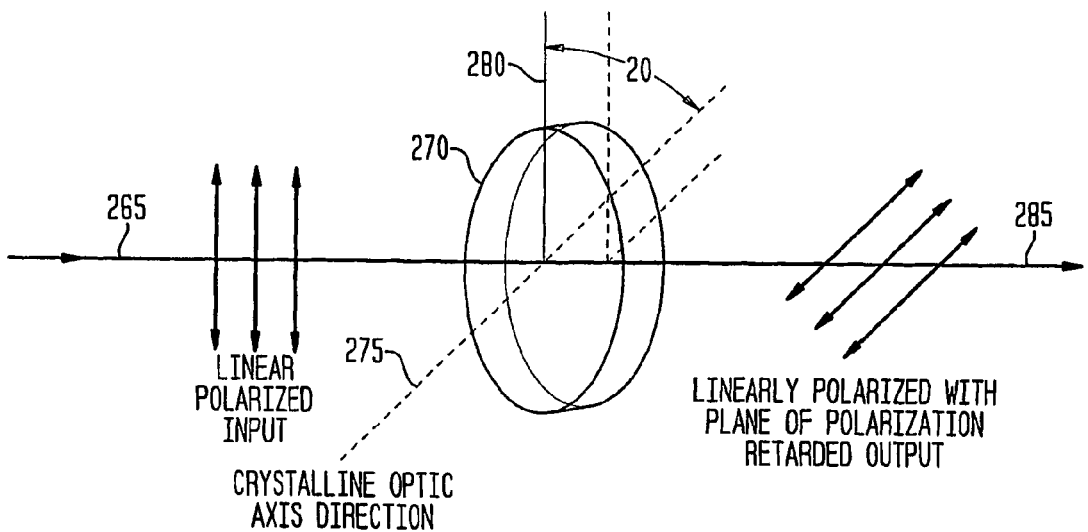

OPTICAL REDUCTION METHOD WITH ELIMINATION OF RETICLE DIFFRACTION INDUCED BIAS

CROSS REFERENCE TO RELATED APPLICATIONS

This application is a continuation of U.S. patent application Ser. No. 10/366,614, filed Feb. 14, 2003 now U.S. Pat. No. 6,836,380, which is a continuation of U.S. patent application Ser. No. 09/841,166, filed Apr. 25, 2001 now U.S. Pat. No. 6,522,483, which claims the benefit of U.S. Provisional Pat. Appl. No. 60/199,392, filed Apr. 25, 2000, each of which is hereby incorporated by reference herein in its entirety.

BACKGROUND OF THE INVENTION

1. Field of the Invention

This invention relates generally to optical systems used in semiconductor manufacturing.

2. Background Art

Semiconductor devices are typically manufactured using various photolithographic techniques. The circuitry used in a semiconductor chip is projected from a reticle onto a wafer. This projection is often accomplished with the use of optical systems. The design of these optical systems is often complex, and it is difficult to obtain the desired resolution necessary for reproducing the ever-decreasing size of components being placed on a semiconductor chip. Therefore, there has been much effort expended to develop an optical reduction system capable of reproducing very fine component features, less than 0.25 microns. The need to develop an optical system capable of reproducing very fine component features requires the improvement of system performance.

A conventional optical system is disclosed in U.S. Pat. No. 5,537,260 entitled "Catadioptric Optical Reduction System with High Numerical Aperture" issued Jul. 16, 1996 to Williamson, which is incorporated by reference herein in its entirety. This reference describes an optical reduction system having a numerical aperture of 0.35. Another optical system is described in U.S. Pat. No. 4,953,960 entitled "Optical Reduction System" issuing Sep. 4, 1990 to Williamson, which is incorporated by reference herein in its entirety. This reference describes an optical system operating in the range of 248 nanometers and having a numerical aperture of 0.45.

BRIEF SUMMARY OF THE INVENTION

While these optical systems perform adequately for their intended purpose, there is an ever increasing need to improve system performance. The present inventor has identified that a need exists for eliminating diffraction induced by bias at the reticle. Further, there is a need for an optical system having low reticle diffraction capable of acceptable system performance over a large spectral waveband.

Reticle diffraction induced bias results from the way linearly polarized light interacts with the features of the reticle. The feature orientation of the reticle is determined by the semiconductor device being projected. Since there is an increasing need to reduce the size of semiconductor devices and feature orientation is dictated by the application of the semiconductor device, the present inventor focused on treating reticle diffraction.

Linearly polarized light is typically used in certain photolithographic projection optic systems. Diffraction results from the interaction of light and the features on the reticle. Linearly polarized light travels through the reticle differently depending on the orientation of its features. Asymmetries result from this interaction. The asymmetries or print biases are then projected through the optical system onto the wafer. Print bias is significant enough to alter the thickness of the lines projected on the wafer. Variations on the wafer affect the performance of the semiconductor device, and in some cases prevent the device from performing to required specifications.

The use of circularly polarized light at the reticle can eliminate the asymmetries which result from feature orientation. This circularly polarized light is indistinguishable from unpolarized light in its imaging behavior. The imaging behavior of unpolarized light is such that it diffracts equally regardless of the orientation of the feature through which it is projected. Thus the print biases are reduced throughout the optical system.

However, other factors, such as transmission loss, prevent the use of circularly polarized light throughout an optical system. Thus, the present invention involves the use of phase shifters, which can take the form of wave plates, retardation plates and the like, to selectively alter the polarization of the light before the reticle and optical system.

In one embodiment, the present invention is a catadioptric optical reduction system for use in the photolithographic manufacture of semiconductor devices having one or more quarter-wave plates operating near the long conjugate end. A quarter-wave plate after the reticle provides linearly polarized light at or near the beamsplitter. A quarter-wave plate before the reticle provides circularly polarized or generally unpolarized light at or near the reticle. Additional quarter-wave plates are used to further reduce transmission loss and asymmetries from feature orientation. The catadioptric optical reduction system provides a relatively high numerical aperture of 0.7 capable of patterning features smaller than 0.25 microns over a 26 mm×5 mm field. The optical reduction system is thereby well adapted to a step and scan microlithographic exposure tool as used in semiconductor manufacturing. Several other embodiments combine elements of different refracting power to widen the spectral bandwidth which can be achieved.

In another embodiment, the present invention is a catadioptric reduction system having, from the object or long conjugate end to the reduced image or short conjugate end, an first quarter-wave plate, a reticle, a second quarter-wave plate, a first lens group, a second lens group, a beamsplitter cube, a concentric concave mirror, and a third lens group. The first quarter-wave plate operates to circularly polarize the radiation passed to the reticle. The second quarter-wave plate operates to linearly polarize the radiation after the reticle before the first lens group. The concave mirror operates near unit magnification. This reduces the aberrations introduced by the mirror and the diameter of radiation entering the beamsplitter cube. The first and second lens groups before the concave mirror provide enough power to image the entrance pupil at infinity at the aperture stop at or near the concave mirror. The third lens group after the concave mirror provides a substantial portion of the reduction from object to image of the optical system, as well as projecting the aperture stop to an infinite exit pupil. High-order aberrations are reduced by using an aspheric concave mirror.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention. In the drawings:

FIG. 2B is an illustration of the properties of a quarter-wave plate.

FIG. 2C is an illustration of the properties of a half wave plate.

Figure 1:
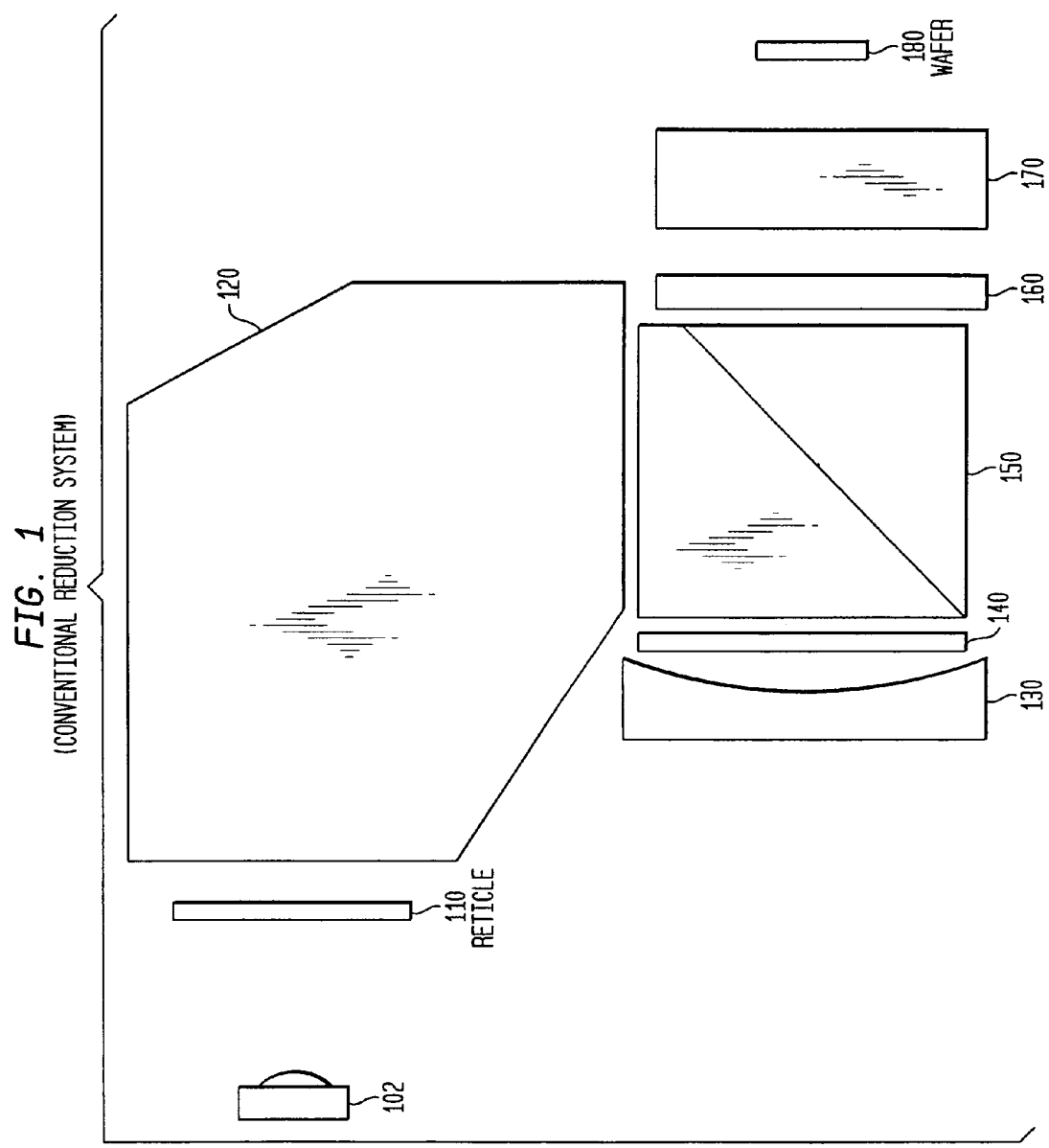
FIG. 1 is a schematic illustration of a conventional optical projection system.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

I. Overview
   A. Conventional Optical System
   B. Reticle Diffraction
   C. Polarization and Wave Plates II. Terminology III. Example Implementations
   A. Optical System With Elimination of Reticle Diffraction Induced Bias
   B. Alternate Embodiment
   C. Further Embodiments IV. Alternate Implementation I. Overview
   A. Conventional Optical System FIG. 1 illustrates a conventional optical reduction system. From its long conjugate end where the reticle is placed to its short conjugate end where the wafer is placed, it possesses a first optical component group 120, a beamsplitter cube 150, a first quarter-wave plate 140, a concave mirror 130, a second quarter-wave plate 160, and a second optical component group 170. A feature of any optical system is the interdependence of numerical aperture size and spectral radiation requirements. In order to efficiently illuminate the image or wafer plane 180, linearly polarized light is used. The limitations of linearly polarized light are introduced above and discussed in the following sections.

B. Reticle Diffraction Induced Bias

Figure 2A:
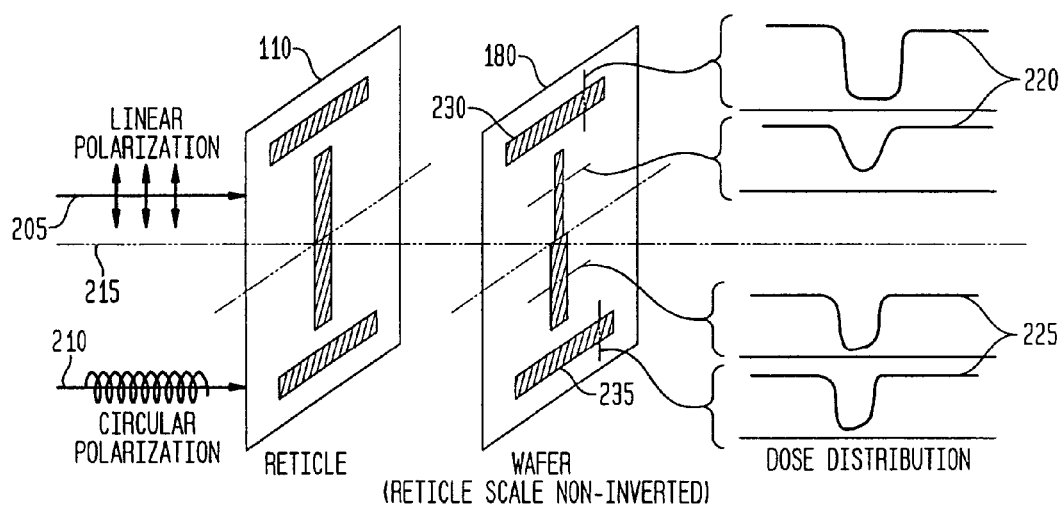
FIG. 2A is an illustration of diffraction at the reticle.

As recognized by the present inventor, the use of linearly polarized light at numerical apertures greater than about 0.5 introduces small, but noticeable, asymmetries in the imaging. These asymmetries in imaging are caused at least in part by diffraction of the linearly polarized light at certain feature orientations. FIG. 2A illustrates the asymmetries or print biases which result from the use of linearly polarized light at the reticle 110. Simply, reticle 110 is placed in the path of both linearly polarized light 205 and circularly polarized light 210. The two types of light are separated by separator 215. After the reticle, the intensity of the light is distributed differently, as shown by distribution curves 220 and 225. The results are shown on wafer 180. Here, the projected image 230 resulting from the use of linearly polarized light 205 is not as clear or sharp as projected image 235 which results from the use of circularly polarized light 210.

Circularly polarized light 210 is indistinguishable from unpolarized light in its imaging behavior. The imaging behavior of unpolarized light is such that it diffracts equally regardless of the orientation of the feature through which it is projected. When the projection optic cannot accept unpolarized light, but requires linearly polarized light, it is possible to provide circularly polarized light to illuminate the reticle and thereby eliminate the feature orientation bias. Thus, print biases are reduced.

C. Polarization and Wave Plates

The properties of wave plates are shown in FIGS. 2B and 2C. FIG. 2B illustrates the properties of a quarter-wave plate. Linearly polarized input 240 enters the wave plate 245 at the input polarization plane 255. The optic axis 250 and other factors discussed in detail below determine the orientation of the output light. Here, wave plate 245 is designed to produce circularly polarized output 260.

Similarly, FIG. 2C illustrates the properties of a half-wave plate. Linearly polarized input 265 enters the wave plate 270 at the input polarization plane 280. The optic axis 275 and other factors discussed in detail below determine the orientation of the output light. Here, wave plate 270 is designed to produce linearly polarized with plane of polarization retarded output 285.

Wave plates (retardation plates or phase shifters) are made from materials which exhibit birefringence. Birefringent materials, such as crystals, are generally anisotropic. This means that the atomic binding forces on the electron clouds are different in different directions and as a result so are the refractive indices.

In the case of uniaxial birefringent crystals, a single symmetry axis (actually a direction) known as the optic axis (shown in FIGS. 2B and 2C as elements 250 and 275, respectively) displays two distinct principal indices of refraction: the maximum index $n_o$ (the slow axis) and the minimum index $n_e$ (the fast axis). These two indices correspond to light field oscillations parallel and perpendicular to the optic axis.

The maximum index results in ordinary rays passing through the material. The minimum index results in extraordinary rays passing through the material. The velocities of the extraordinary and ordinary rays through the birefringent materials vary intensely with their refractive indices. The difference in velocities gives rise to a phase difference when the two beams recombine. In the case of an incident linearly polarized beam this is given by:

$$\alpha = 2\pi d \frac{(n_e - n_o)}{\lambda};$$

where α is the phase difference; d is the thickness of wave plate; $n_e$, $n_o$ are the refractive indices of the extraordinary and ordinary rays respectively, and λ is the wavelength. Thus, at any specific wavelength the phase difference is governed by the thickness of the wave plate.

As discussed above, FIG. 2B illustrates the operation of a quarter-wave plate. The thickness of the quarter-wave plate is such that the phase difference is ¼-wavelength (zero order) or some multiple of ¼ wavelength (multiple order). If the angle between the electric field vector of the incident linearly polarized beam and the retarder principal plane of the quarter-wave plate is 45 degrees, the emergent beam is circularly polarized.

Additionally, when a quarter-wave plate is double passed, e.g., when the light passes through it twice because it is reflected off a mirror, it acts as a half-wave plate.

By quarter-wave plate is meant a thickness of birefringent material which introduces a quarter of a wavelength of the incident light. This is in contrast to an integral number of half plus quarter-waves or two thicknesses of material whose phase retardance differs by a quarter-wave. The deleterious effects of large angle of incidence variations are thereby minimized at the high numerical aperture by the use of such zero order wave plates, and by restricting the field size in the plane of incidence.

Similarly, FIG. 2C illustrates the operation of a half-wave plate. The thickness of a half-wave plate is such that the phase difference is ½-wavelength (zero order) or some odd multiple of ½-wavelength (multiple order). A linearly polarized beam incident on a half-wave plate emerges as a linearly polarized beam but rotated such that its angle to the optical axis is twice that of the incident beam.

II. Terminology

To more clearly delineate the present invention, an effort is made throughout the specification to adhere to the following term definitions as consistently as possible.

The term "circuitry" refers to the features designed for use in a semiconductor device.

The term "feature orientation" refers to the patterns printed on a reticle to projection.

The term "long conjugate end" refers to the plane at the object or reticle end of the optical system.

The term "print bias" refers to the variations in the lines on the wafer produced by asymmetries in the optical system. Asymmetries are produced by diffraction at various stages of the system and the reticle.

The term "semiconductor" refers to a solid state substance that can be electrically altered.

The term "semiconductor chip" refers to semiconductor device possessing any number of transistors or other components.

The term "semiconductor device" refers to electronic equipment possessing semiconductor chips or other elements.

The term "short conjugate end" refers to the plane at the image or wafer end of the optical system.

The term "wave plate" refers to retardation plates or phase shifters made from materials which exhibit birefringence.

III. Example Implementations

A. Optical System With Elimination of Reticle Diffraction Induced Bias

Figure 3:
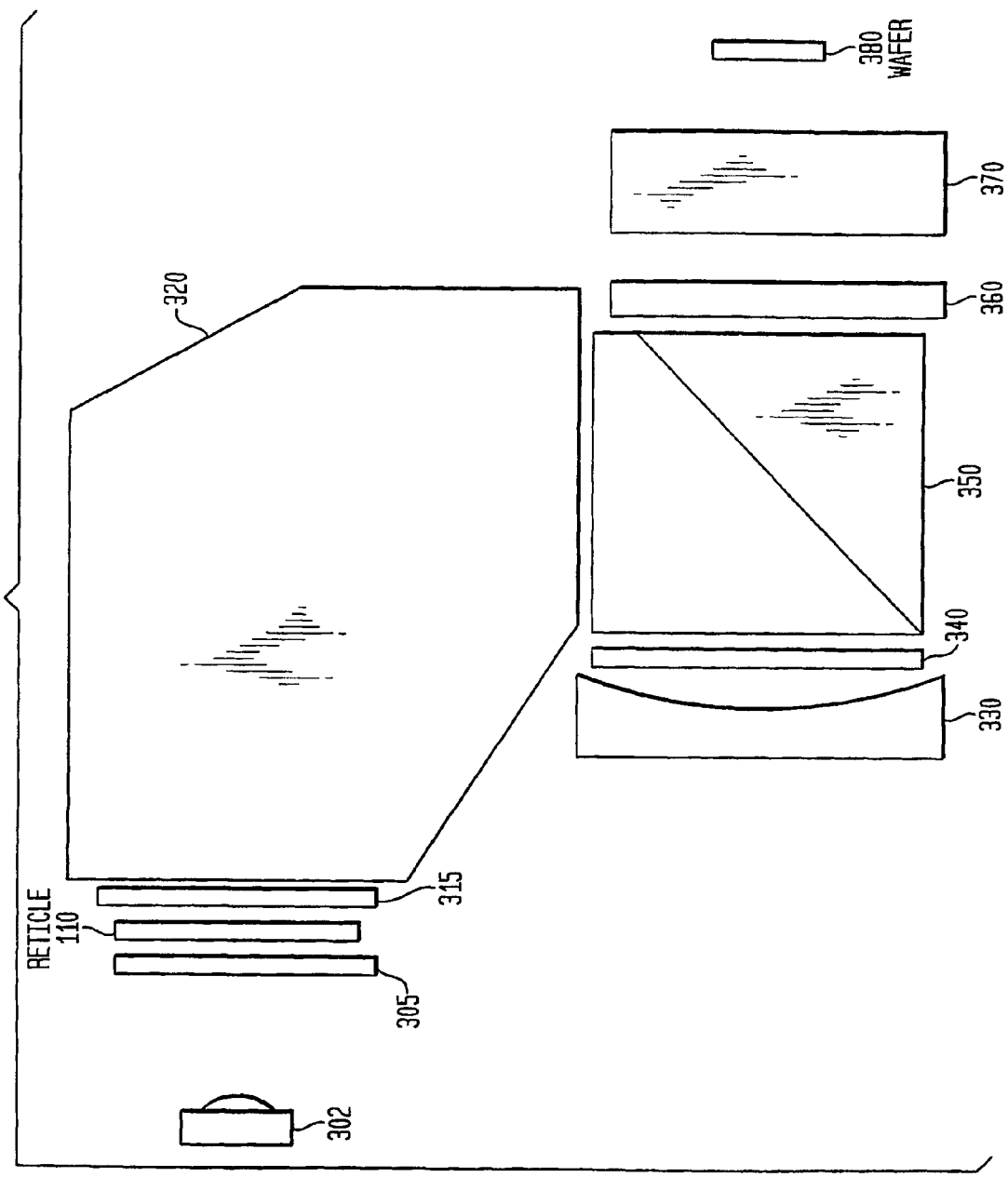
FIG. 3 is a schematic illustration of the present invention using more than two quarter-wave plates.

The present invention uses circularly polarized light to eliminate the reticle diffraction induced biases of conventional systems. FIG. 3 illustrates an embodiment of the present invention that eliminates such asymmetries or print biases. A first quarter-wave plate 305 is introduced before the object or reticle plane 110. First quarter-wave plate 305 converts the linearly polarized light into circularly polarized light, as illustrated in FIG. 2B. As discussed above, circularly polarized light is indistinguishable from unpolarized light in its imaging behavior. The imaging behavior of unpolarized light is such that it diffracts equally regardless of the orientation of the feature through which it is projected. Thus the print biases which result from reticle diffraction are reduced.

In order to minimize transmission loss through the rest of the optical system, second quarter-wave plate 315 is inserted to linearly polarize the radiation before the optical component group 320.

With respect to quarter-wave plates 305, 315, 340 and 360, one orientation is to have the first quarter-wave plate 305 oriented with its fast axis parallel to that of the input light. The second quarter-wave plate 315 and fourth quarter-wave plate 360 have their fast axes in a parallel orientation but perpendicular to the fast axis of third quarter-wave plate 340.

B. Alternate Embodiment

Figure 4:
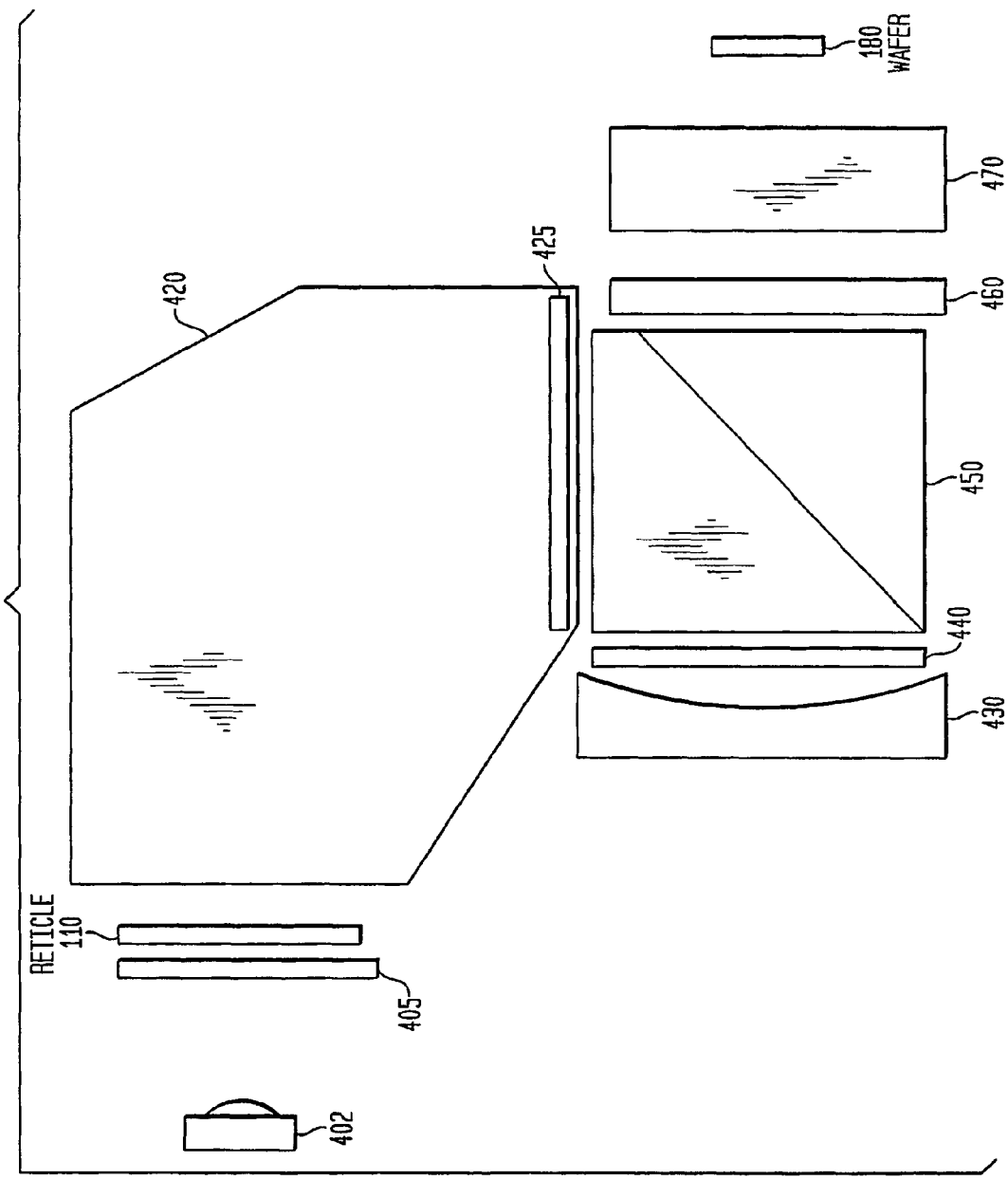
FIG. 4 is a schematic illustration of an alternative embodiment.

It is also apparent to one skilled in the relevant art that second quarter-wave plate 315 could be inserted into the system anywhere before the beamsplitter 350. This aspect is shown in FIG. 4 where second quarter-wave plate 425 serves the same function. The transmission loss caused by the use of circularly polarized light within optical component group 320 influences the placement of second quarter-wave plate 425.

Specifically, the use of unpolarized or circularly polarized light at the beamsplitter would cause a transmission loss of 50%. If a non-polarized beamsplitter were to be used, 75% of the light would be lost. Therefore, while alternate embodiments are possible, they may not be feasibly implemented.

With respect to quarter-wave plates 405, 425, 440 and 460, one orientation is to have the first quarter-wave plate 405 oriented with its fast axis parallel to that of the input light. The second quarter-wave plate 425 and fourth quarter-wave plate 460 have their fast axes in a parallel orientation but perpendicular to the fast axis of third quarter-wave plate 440.

C. Further Embodiments

The present invention can be implemented in various projection optic systems. For example, the present invention can be implemented in catadioptric systems as described in detail herein, as well as refractive and reflective systems. On skilled in the relevant art, based at least on the teachings provided herein, would recognize that the embodiments of the present invention are applicable to other reduction systems. More detailed embodiments of the present invention as provided below.

Figure 5:
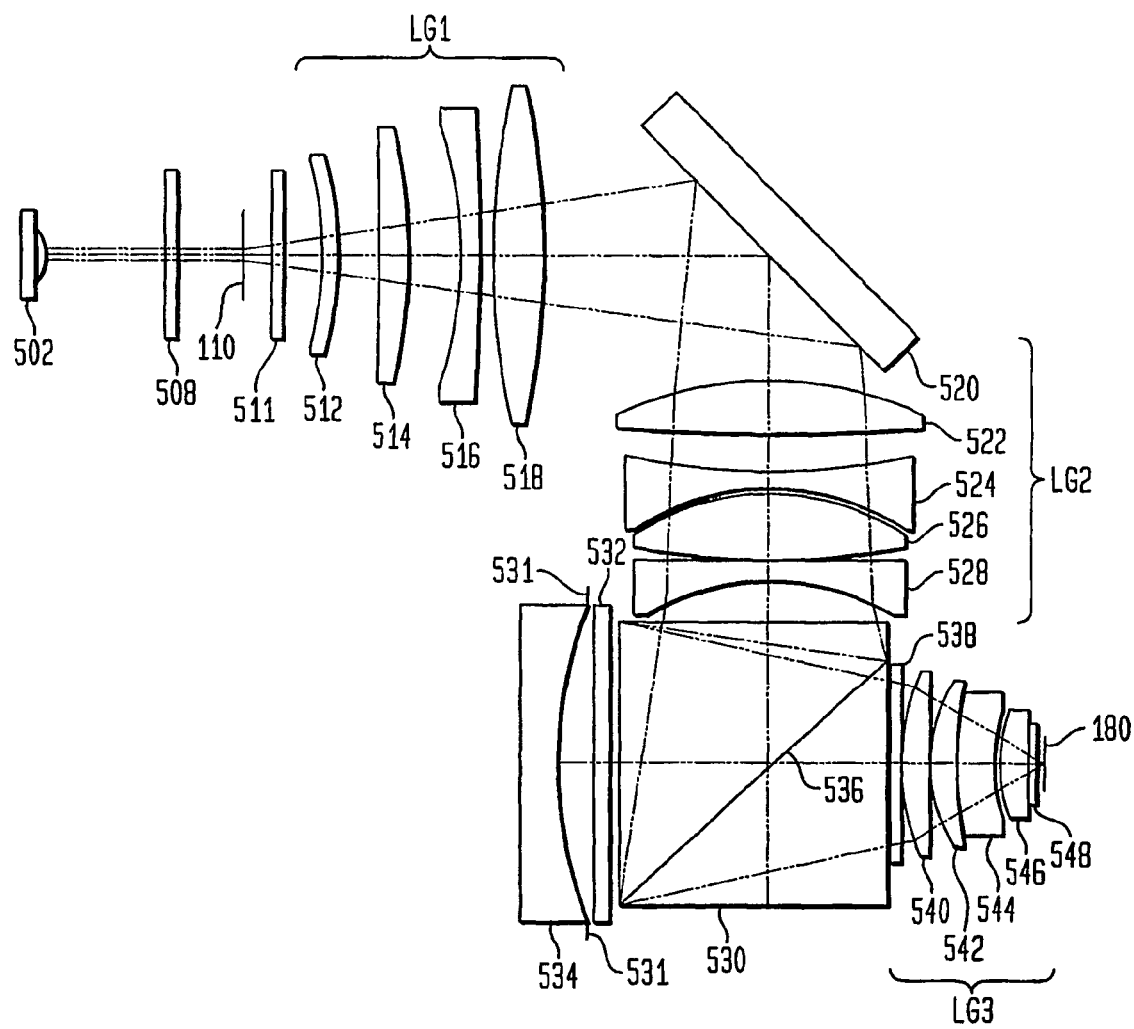
FIG. 5 is a schematic illustration of one embodiment of the present invention using a single refracting material.

FIG. 5 illustrates one embodiment, of the optical reduction system of the present invention. From its long conjugate end, it comprises an first quarter-wave plate 508, an object or reticle plane 110, a second quarter-wave plate 511, a first lens group LG1, a folding mirror 520, a second lens group LG2, a beamsplitter cube 530, a third quarter-wave plate 532, a concave mirror 534, a second quarter-wave plate 538, and a third lens group LG3. The image is formed at image or wafer plane 180. The first lens group LG1 comprises a shell 512, a spaced doublet including positive lens 514 and negative lens 516, and positive lens 518. The shell 512 is an almost zero power or zero power lens. The second lens group LG2 comprises a positive lens 522, a spaced doublet including a negative lens 524 and a positive lens 526, and negative lens 528. The third lens group LG3 comprises two positive lenses 540 and 542, which are strongly positive, shell 544, and two positive lenses 546 and 548, which are weakly positive. The first quarter-wave plate 508 passes circularly polarized light incident upon the object or reticle plane 110. The folding mirror 520 is not essential to the operation of the present invention. However, the folding mirror permits the object and image planes to be parallel which is convenient for one intended application of the optical system of the present invention, which is the manufacture of semiconductor devices using photolithography with a step and scan system.

Radiation enters the system at the long conjugate end and passes through the first lens group LG1, is reflected by the folding mirror 520, and passes through the second lens group LG2. The radiation enters the beamsplitter cube 530 and is reflected from surface 536 passing through quarter-wave plate 532 and reflected by concave mirror 534. The radiation then passes back through the quarter-wave plate 532, the beamsplitter cube 530, the quarter-wave plate 538, lens group LG3, and is focused at the image or wafer plane 180.

Lens groups upstream of the mirror, LG1 and LG2, provide only enough power to image the entrance pupil at infinity to the aperture stop 531 at or near the concave mirror 534. The combined power of lens groups LG1 and LG2 is slightly negative. The shell 512 and air spaced doublet 514 and 516 assist in aberration corrections including astigmatism, field curvature, and distortion. The lens group LG3, after the concave mirror 534, provides most of the reduction from object to image size, as well as projecting the aperture stop to an infinite exit pupil. The two strongly positive lenses 540 and 542 provide a high numerical aperture at the image and exit pupils and infinity. The shell 544 has almost no power. The two weakly positive lenses 546 and 548 help correct high order aberrations. The concave mirror 534 may provide a reduction ratio of between 1.6 and 2.7 times that of the total system.

The negative lens 524 in the second lens group LG2 provides a strongly diverging beam directed at the beamsplitter cube 530 and concave mirror 534. The strongly positive lens 522 provides lateral color correction. The air space doublet comprising lenses 524 and 526 helps to correct spherical aberrations and coma. Concave mirror 534 is preferably aspheric, therefore helping further reduce high order aberrations.

The transmission losses introduced by the beamsplitter cube 530 are minimized by illuminating the object or reticle with linearly polarized light and including a quarter-wave plate 532 between the beamsplitter cube 530 and the concave mirror 534. Additionally, by increasing the numerical aperture in lens group LG3, after the concave mirror 534 and beamsplitter cube 530, the greatest angular range is not seen in these elements.

However, the use of linearly polarized light at numerical apertures greater than about 0.5 introduces small but noticeable asymmetries in the imaging. In the present invention, this can effectively be removed by introducing another quarter-wave plate 538 after the final passage through the beamsplitter cube 530, thereby converting the linearly polarized light into circularly polarized light. This circularly polarized light is basically indistinguishable from unpolarized light in its imaging behavior.

The optical system illustrated in FIG. 5 is designed to operate at a reduction ratio of 4 to 1. Therefore, the numerical aperture in the image space is reduced from 0.7 by a factor of 4 to 0.175 at the object or reticle plane 110. In other words, the object space numerical aperture is 0.175 and the image space numerical aperture is 0.7. Upon leaving the first lens group LG1 the numerical aperture is reduced to 0.12, a consequence of the positive power needed in lens group LG1 to image the entrance pupil at infinity to the aperture stop of the system close to the concave mirror 534. The numerical aperture after leaving the second lens group LG2 and entering the beamsplitter is 0.19. Therefore, the emerging numerical aperture from the second lens group LG2, which is 0.19, is larger than the entering or object space numerical aperture of lens group LG1, which is 0.175. In other words, the second lens group LG2 has an emerging numerical aperture greater than the entering numerical aperture of the first lens group LG1. This is very similar to the object space numerical aperture, which is 0.175, due to the overall negative power of the second lens group LG2. This is contrary to prior art systems where the numerical aperture entering a beamsplitter cube is typically close to zero or almost collimated. The concave mirror 534 being almost concentric, the numerical aperture of the radiation reflected from it is increased only slightly from 0.19 to 0.35. The third lens group LG3 effectively doubles the numerical aperture to its final value of 0.7 at the wafer or image plane 180.

The present invention achieves its relatively high numerical aperture without obstruction by the edges of the beamsplitter cube by means of the negative second group LG2 and the strongly positive third lens group LG3. The use of the beamsplitter cube 530 rather than a plate beamsplitter is important in the present invention because at numerical apertures greater than about 0.45 a beamsplitter cube will provide better performance. There is a reduction of the numerical aperture within the cube by the refractive index of the glass, as well as the absence of aberrations that would be introduced by a tilted plate beamsplitter in the non-collimated beam entering the beamsplitter. The construction data for the lens system illustrated in FIG. 5 according to the present invention is given in Table 1 below.

TABLE 1

| Element Number | Radius of Curvature (mm) Front | Radius of Curvature (mm) Back | Thickness (mm) | Aperture Diameter (mm) Front | Aperture Diameter (mm) Back | Glass |
|---|---|---|---|---|---|---|
| 508 | Infinite | Infinite | 4.500 | 123.0000 | 123.0000 | Silica |
| Space | | | 0.7500 | | | |
| 110 | Infinite | | 63.3853 | | | |
| Space | | | 0.7500 | | | |
| 511 | Infinite | Infinite | 4.500 | 123.0000 | 123.0000 | Silica |
| Space | | | 0.7500 | | | |
| 512 | −158.7745 | −177.8880 | 15.0000 | 124.0478 | 131.7725 | Silica |
| Space | | | 36.1130 | | | |
| 514 | −556.6911 | −202.0072 | 22.2126 | 148.3881 | 152.5669 | Silica |
| Space | | | 38.7188 | | | |
| 516 | −183.7199 | −558.8803 | 15.0000 | 156.5546 | 166.5750 | Silica |
| Space | | | 10.0674 | | | |

TABLE 1-continued

| Element Number | Radius of Curvature (mm) Front | Radius of Curvature (mm) Back | Thickness (mm) | Aperture Diameter (mm) Front | Aperture Diameter (mm) Back | Glass |
|---|---|---|---|---|---|---|
| 518 | 427.2527 | −612.2450 | 28.8010 | 177.4010 | 179.0292 | Silica |
| Space | | | 132.3320 | | | |
| 520 | Infinite | | −74.0000 | 184.6402 | | Reflection |
| 522 | −240.4810 | 2050.9592 | −33.3135 | 188.4055 | 185.3395 | Silica |
| Space | | | −29.3434 | | | |
| 524 | 421.7829 | −145.6176 | −12.0000 | 175.5823 | 169.0234 | Silica |
| Space | | | −4.2326 | | | |
| 526 | −150.4759 | 472.0653 | −46.5091 | 171.4244 | 169.9587 | Silica |
| Space | | | −2.0000 | | | |
| 528 | −1472.2790 | −138.2223 | −15.0000 | 165.3586 | 154.8084 | Silica |
| Space | | | −27.2060 | | | |
| 530 | Infinite | Infinite | −91.8186 | 155.6662 | 253.0917 | Silica |
| 536 | Infinite | | | 253.0917 | | Reflection |
| 530 | Infinite | Infinite | 91.8186 | 253.0917 | 253.0917 | Silica |
| Space | | | 2.0000 | | | |
| 532 | Infinite | Infinite | 6.0000 | 185.8693 | 186.8401 | Silica |
| Space | | | 17.9918 | | | |
| Stop | | | | 188.0655 | | |
| 534 | Aspheric | | −17.9918 | 188.0655 | | Reflection |
| 532 | Infinite | Infinite | −6.0000 | 183.5471 | 180.1419 | Silica |
| Space | | | −2.0000 | | | |
| 530 | Infinite | Infinite | −91.8186 | 178.3346 | 149.2832 | Silica |
| 530 | Infinite | Infinite | −70.000 | 149.2832 | 128.8604 | Silica |
| Space | | | −2.0000 | | | |
| 538 | Infinite | Infinite | −4.500 | 127.9681 | 126.6552 | Silica |
| Space | | | −0.7500 | | | |
| 540 | −175.1330 | 1737.4442 | −17.7754 | 121.4715 | 118.2689 | Silica |
| Space | | | −0.7500 | | | |
| 542 | −108.8178 | −580.1370 | −18.2407 | 104.5228 | 97.7967 | Silica |
| Space | | | −0.7500 | | | |
| 544 | −202.2637 | −86.6025 | −31.1216 | 91.7061 | 57.4968 | Silica |
| Space | | | −2.3507 | | | |
| 546 | −122.1235 | −488.7122 | −17.9476 | 56.4818 | 41.1675 | Silica |
| Space | | | −0.2000 | | | |
| 548 | −160.8506 | −360.1907 | −6.1500 | 39.4528 | 33.5764 | Silica |
| Space | | | −4.000 | | | |
| 180 | Infinite | | | 26.5019 | | |

Concave mirror 534 has an aspheric reflective surface according to the following equation:

$$Z = \frac{(CURV)Y^2}{1+\sqrt{1-(1+k)(CURV)^2 Y^2}} + (A)Y^4 + (B)Y^6 + (D)Y^{10} + (E)Y^{12} + (F)Y^{14};$$

wherein the constants are as follows:

CURV=−0.00289051
K=0.000000
A=6.08975×10$^{-11}$
B=2.64378×10$^{14}$
C=9.82237×10$^{-19}$
D=7.98056×10$^{-23}$
E=−5.96805×10$^{-27}$
F=4.85179×10$^{-31}$

The lens according to the construction in Table 1 is optimized for radiation centered on 248.4 nanometers. The single refracting material of fused silica and the large portion of refracting power restricts the spectral bandwidth of the embodiment illustrated in FIG. 5 to about 10 picometers or 0.01 nanometers. This spectral bandwidth is more than adequate for a line narrowed krypton fluoride excimer laser light source. The embodiment illustrated in FIG. 5 can be optimized for any wavelength for which fused silica transmits adequately.

Figure 6:
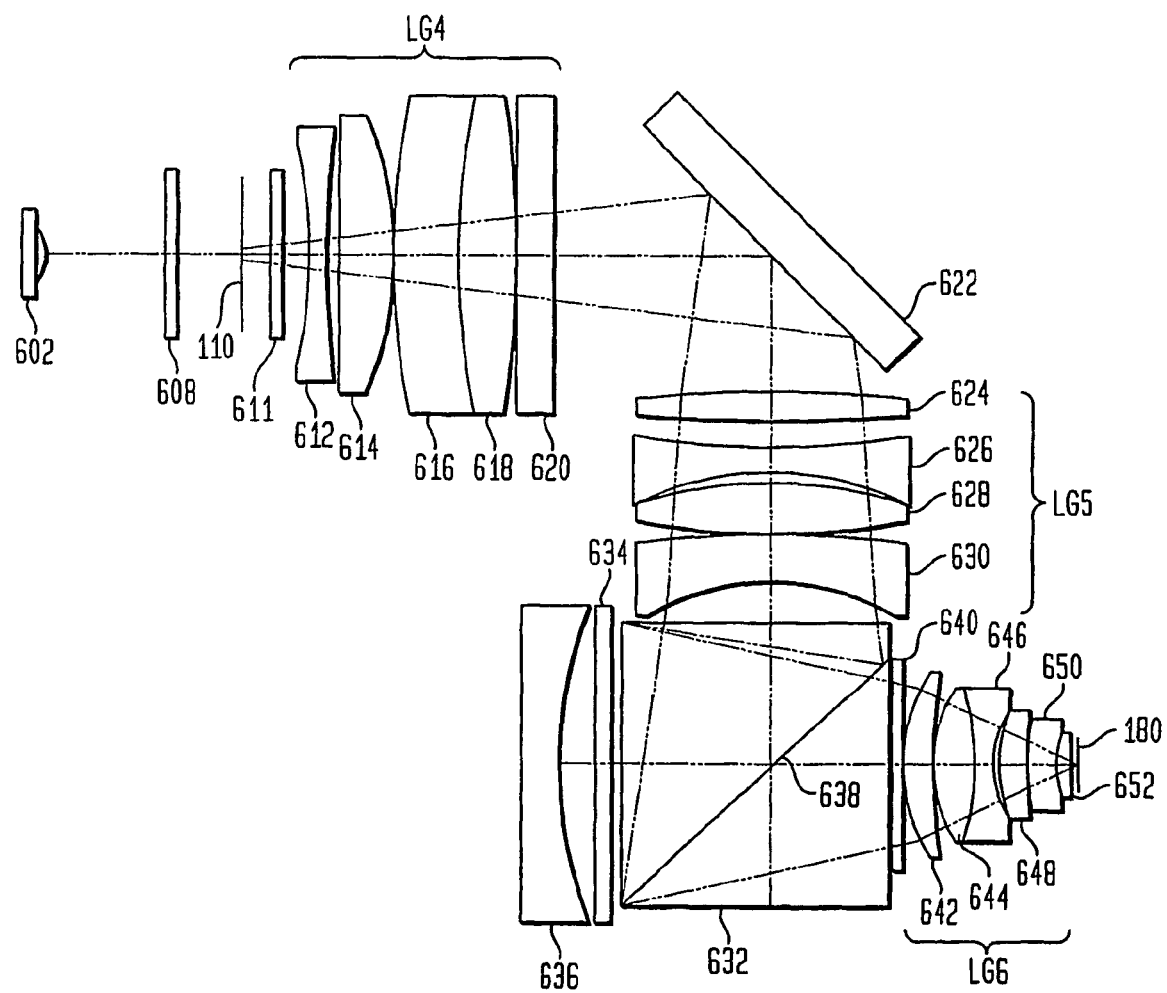
FIG. 6 is another embodiment of the present invention using two different refracting materials.

A wider spectral bandwidth can be achieved by the use of two optical materials with different dispersions. A second embodiment of the present invention is illustrated in FIG. 6. From its long conjugate end, it comprises a first quarter-wave plate 608, an object or reticle plane 110, a second quarter-wave plate 611, a lens group LG4, a folding mirror 622, a lens group LG5, a beamsplitter cube 632 having surface 638, a third quarter-wave plate 634, a concave mirror 636, a fourth quarter-wave plate 640, and lens group LG6. The image is formed at image or wafer plane 180. The lens group LG4 comprises a spaced doublet including negative lens 612 and positive lens 614, a weak positive lens 616, positive lens 618, and shell 620. The lens group LG5 comprises a positive lens 624, a negative lens 626, a positive lens 628, and a negative lens 630. The lens group LG6 comprises two positive lenses 642, cemented doublet including positive lens 644 and negative lens 646, positive lens 648, and cemented doublet including shell 650 and positive lens 652.

This second embodiment uses calcium fluoride in one of the individual positive lenses of the lens group LG4, negative lenses of the lens group LG5, and two of the positive lenses of the lens group LG6. The construction data of the second embodiment illustrated in FIG. 6 of the present invention is given in Table 2 below.

TABLE 2

| Element Number | Radius of Curvature (mm) Front | Radius of Curvature (mm) Back | Thickness (mm) | Aperture Diameter (mm) Front | Aperture Diameter (mm) Back | Glass |
|---|---|---|---|---|---|---|
| 608 | Infinite | Infinite | 4.5000 | 123.0000 | 123.0000 | Silica |
| Space | | | 0.5000 | | | |
| 110 | Infinite | | 60.4852 | | | |
| Space | | | 0.5000 | | | |
| 611 | Infinite | Infinite | 4.5000 | 123.0000 | 123.0000 | Silica |
| 612 | −205.5158 | 539.1791 | 15.2158 | 124.0926 | 137.3346 | Silica |
| Space | | | 8.8054 | | | |
| 614 | 2080.9700 | −210.6539 | 32.4984 | 142.6149 | 151.7878 | Silica |
| Space | | | 1.2676 | | | |
| 616 | 310.4463 | 700.3748 | 40.7304 | 162.4908 | 165.2126 | CaFl |
| Space | | | 0.5000 | | | |
| 618 | 634.1820 | −798.8523 | 27.5892 | 165.4595 | 166.4747 | Silica |
| Space | | | 0.5000 | | | |
| 620 | 1480.0597 | 1312.1247 | 25.4322 | 168.7516 | 164.7651 | Silica |
| Space | | | 136.2343 | | | |
| 622 | Infinite | | −74.0000 | 161.9590 | | Reflection |
| 624 | −761.9176 | 1088.9351 | −19.2150 | 160.3165 | 159.2384 | Silica |
| Space | | | −19.9465 | | | |
| 626 | 648.8361 | −202.5872 | −12.0000 | 155.1711 | 153.0635 | CaFl |
| Space | | | −7.6304 | | | |
| 628 | −400.4276 | 458.5060 | −25.8769 | 153.0635 | 153.8055 | Silica |
| Space | | | −2.0000 | | | |
| 630 | −818.0922 | −168.5034 | −27.5927 | 152.6663 | 147.5200 | CaFl |
| Space | | | −20.5014 | | | |
| 632 | Infinite | Infinite | −91.7553 | 148.6158 | 252.7349 | Silica |
| 638 | Infinite | | | 252.7349 | | Reflection |
| 632 | Infinite | Infinite | 91.7553 | 252.7349 | 252.7349 | Silica |
| Space | | | 2.0000 | | | |
| 634 | Infinite | Infinite | 6.0000 | 185.8070 | 187.0026 | Silica |
| Space | | | 18.1636 | | | |
| Stop | | | | 188.5681 | | |
| 636 | Aspheric | | −18.1636 | 188.5681 | | Reflection |
| 634 | Infinite | Infinite | −6.0000 | 184.2566 | 181.1084 | Silica |
| Space | | | −2.0000 | | | |
| 632 | Infinite | Infinite | −91.7553 | 179.3838 | 151.7747 | Silica |
| 632 | Infinite | Infinite | −70.0000 | 151.7747 | 133.3985 | Silica |
| Space | | | −2.0000 | | | |
| 640 | Infinite | Infinite | −4.5000 | 132.5690 | 131.3876 | Silica |
| Space | | | −0.5000 | | | |
| 642 | −112.0665 | −597.6805 | −21.4866 | 123.4895 | 119.2442 | Silica |
| Space | | | −0.5000 | | | |
| 644 | −116.3137 | 282.3140 | −24.0940 | 107.8451 | 101.2412 | CaFl |
| 646 | 282.3140 | −66.5293 | −13.7306 | 101.2412 | 72.6862 | Silica |
| Space | | | −2.6346 | | | |
| 648 | −77.2627 | −374.4800 | −17.9594 | 72.0749 | 62.7659 | Silica |
| Space | | | −0.5452 | | | |
| 650 | −130.1381 | −57.1295 | −20.8147 | 58.9696 | 37.4889 | Silica |
| 652 | −57.1295 | −7305.8777 | −6.1425 | 37.4889 | 34.3156 | CaFl |
| Space | | | −4.0000 | | | |
| 180 | Infinite | | | 26.4992 | | | wherein the constants for the aspheric mirror 634 used in the equation after Table 1 are as follows:

CURV=−0.00286744
K=0.000000
A=−1.92013×10$^{-09}$
B=−3.50840×10$^{-14}$
C=2.95934×10$^{-19}$
D=−1.10495×10$^{-22}$
E=9.03439×10$^{-27}$
F=−1.39494×10$^{-31}$

This second embodiment is optimized for radiation centered on 193.3 nanometers and has a spectral bandwidth of about 200 picometers or 0.2 nanometers. A slightly line narrowed argon fluoride excimer laser is an adequate light source. Additionally, the design can be optimized for any wavelength for which both refractive materials transmit adequately. The bandwidth will generally increase for longer wavelengths, as the material dispersions decrease. For example, around 248.4 nanometers such a two-material design will operate over at least a 400 picometers, 0.4 nanometers bandwidth.

At wavelengths longer than 360 nanometers, a wider range of optical glasses begin to have adequate transmission. A third embodiment illustrated in FIG. 7 takes advantage of this wider selection of glasses and further reduced dispersion. From its long conjugate end, it comprises a first quarter-wave plate 708, an object or reticle plane 110, a second quarter-wave plate 711, a lens group LG7, a folding mirror 722, a lens group LG8, a beamsplitter cube 732 having a surface 738, a third quarter-wave plate 734, a concave mirror 736, a fourth quarter-wave plate 740, and lens group LG9. The image is formed at image or wafer plane 180. The lens group LG7 comprises a spaced doublet comprising negative lens 712 and positive lens 714, spaced doublet including positive lens 716 and negative lens 718, and positive lens 720. The lens group LG8 comprises a positive lens 724, a negative lens 726, a positive lens 728, and a negative lens 730. The lens group LG9 comprises a positive lenses 742, cemented doublet including positive lens 744 and negative lens 746, positive lens 748, and cemented doublet including shell 750 and positive lens 752.

Figure 7:
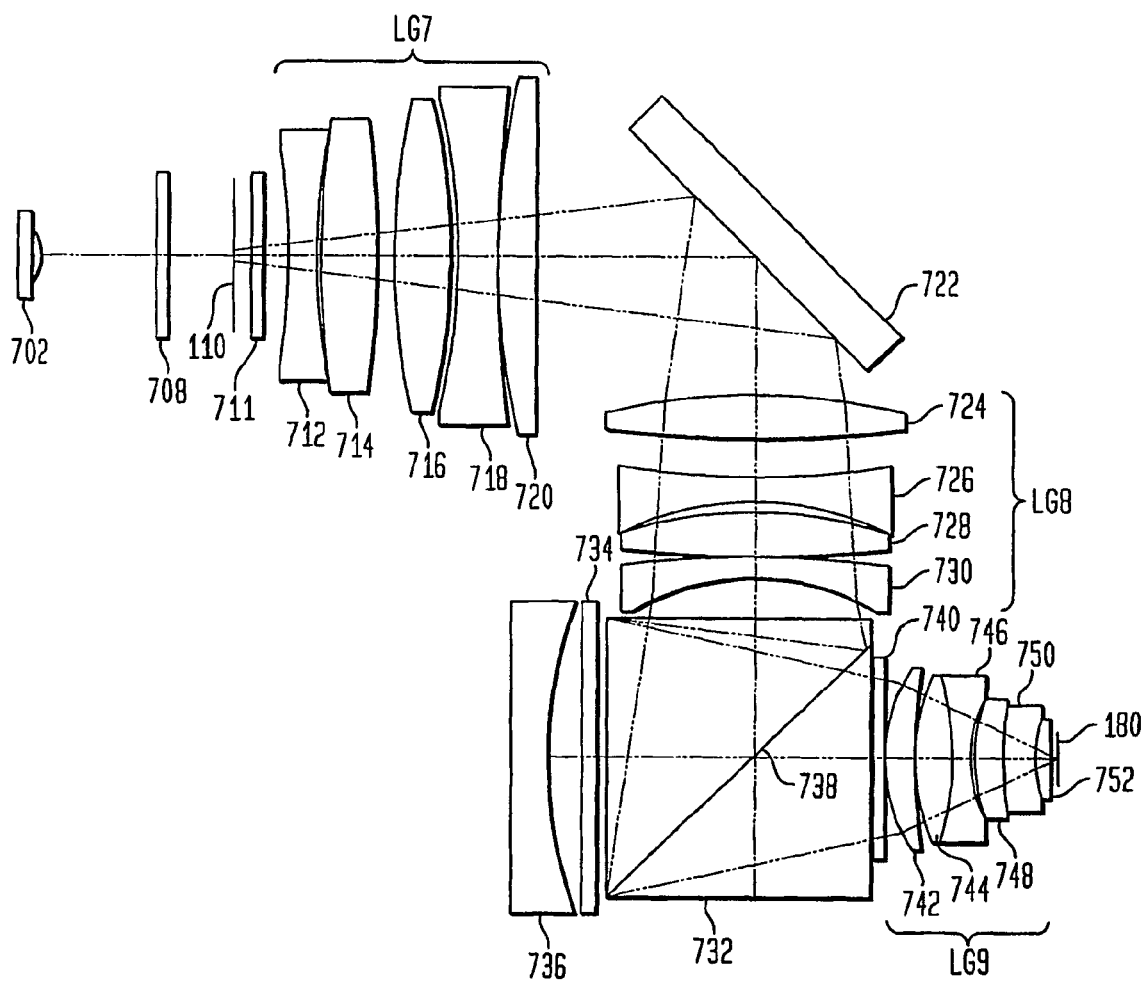
FIG. 7 is another embodiment of the present invention using more than two different refracting materials.

The construction data of the third embodiment illustrated in FIG. 7 is given in Table 3 below.

$E=6.04233 \times 10^{-27}$
$F=3.64479 \times 10^{-32}$

This third embodiment operates over a spectral bandwidth of 8 nanometers centered on 365.5 nanometers. A radiation of this spectral bandwidth can be provided by a filtered mercury arc lamp at the I-line waveband. The optical glasses other than fused silica used in this third embodiment are

TABLE 3

| Element Number | Radius of Curvature (mm) | | Thickness (mm) | Aperture Diameter (mm) | | |
|---|---|---|---|---|---|---|
| | Front | Back | | Front | Back | Glass |
| 708 | Infinite | Infinite | 4.5000 | 125.0000 | 125.0000 | Silica |
| Space | | | 0.5000 | | | |
| 110 | Infinite | | 59.2960 | | | |
| Space | | | 0.5000 | | | |
| 711 | Infinite | Infinite | 4.5000 | 125.0000 | 125.0000 | Silica |
| 712 | −620.7809 | 361.8305 | 20.2974 | 125.9406 | 134.7227 | PBM2Y |
| Space | | | 2.6174 | | | |
| 714 | 515.7935 | −455.1015 | 39.8858 | 135.3384 | 145.6015 | PBM2Y |
| Space | | | 14.7197 | | | |
| 716 | 431.3189 | −239.4002 | 36.9329 | 155.6269 | 157.3014 | BSL7Y |
| Space | | | 0.5000 | | | |
| 718 | −259.6013 | 685.3286 | 26.3534 | 156.9363 | 162.2451 | PBM2Y |
| Space | | | 1.4303 | | | |
| 720 | 361.5709 | −1853.2955 | 23.3934 | 168.7516 | 165.1801 | BAL15Y |
| Space | | | 131.8538 | | | |
| 722 | Infinite | | −77.8469 | 169.9390 | | Reflection |
| 724 | −429.2950 | 455.4247 | −32.3086 | 173.0235 | 171.1102 | PBL6Y |
| Space | | | −27.6206 | | | |
| 726 | 401.0363 | −180.0031 | −12.0000 | 159.3555 | 154.7155 | BSL7Y |
| Space | | | −5.6227 | | | |
| 728 | −258.4722 | 1301.3764 | −26.1321 | 154.7155 | 154.1517 | PBM8Y |
| Space | | | −2.0000 | | | |
| 730 | −1282.8931 | −180.2226 | −12.0000 | 153.1461 | 149.4794 | BSL7Y |
| Space | | | −19.7282 | | | |
| 732 | Infinite | Infinite | −91.7349 | 150.4585 | 252.6772 | Silica |
| 738 | Infinite | | | 252.6772 | | Reflection |
| 732 | Infinite | Infinite | 91.7349 | 252.6772 | 252.6772 | Silica |
| Space | | | 2.0000 | | | |
| 734 | Infinite | Infinite | 6.0000 | 185.6435 | 186.7758 | Silica |
| Space | | | 18.2715 | | | |
| Stop | | | | 188.1745 | | |
| 736 | Aspheric | | −18.2715 | 188.1745 | | Reflection |
| 734 | Infinite | Infinite | −6.0000 | 183.6393 | 180.1377 | Silica |
| Space | | | −2.0000 | | | |
| 732 | Infinite | Infinite | −91.7349 | 178.3236 | 147.9888 | Silica |
| 732 | Infinite | Infinite | −70.0000 | 147.9888 | 126.9282 | Silica |
| Space | | | −2.000 | | | |
| 740 | Infinite | Infinite | −4.5000 | 126.0289 | 124.6750 | Silica |
| Space | | | −0.5000 | | | |
| 742 | −119.8912 | −610.6840 | −18.6508 | 117.5305 | 113.4233 | BSM51Y |
| Space | | | −0.5000 | | | |
| 744 | −114.1327 | 384.9135 | −21.1139 | 102.6172 | 96.4137 | BSL7Y |
| 746 | 384.9135 | −70.2077 | −13.0576 | 96.4137 | 71.1691 | PBL26Y |
| Space | | | −2.8552 | | | |
| 748 | −85.7858 | −400.3240 | −16.9147 | 70.5182 | 61.2633 | BSM51Y |
| Space | | | −0.8180 | | | |
| 750 | −151.5235 | −54.0114 | −19.5810 | 57.6234 | 37.3909 | BSM51Y |
| 752 | −54.0114 | −2011.1057 | −6.3947 | 37.3909 | 34.2119 | PBL6Y |
| Space | | | −4.0000 | | | |
| 180 | Infinite | | | 26.5002 | | | wherein the constants for the aspheric mirror 736 used in the equation after Table 1 as follows:

$CURV=-0.00291648$ $K=0.000000$ $A=-1.27285 \times 10^{-9}$ $B=-1.92865 \times 10^{-14}$ $C=6.21813 \times 10^{-19}$ $D=-6.80975 \times 10^{23}$ commonly known as I-line glasses. These optical glasses have the least absorption or solarization effects at the mercury I-line wavelength.

Figure 8:
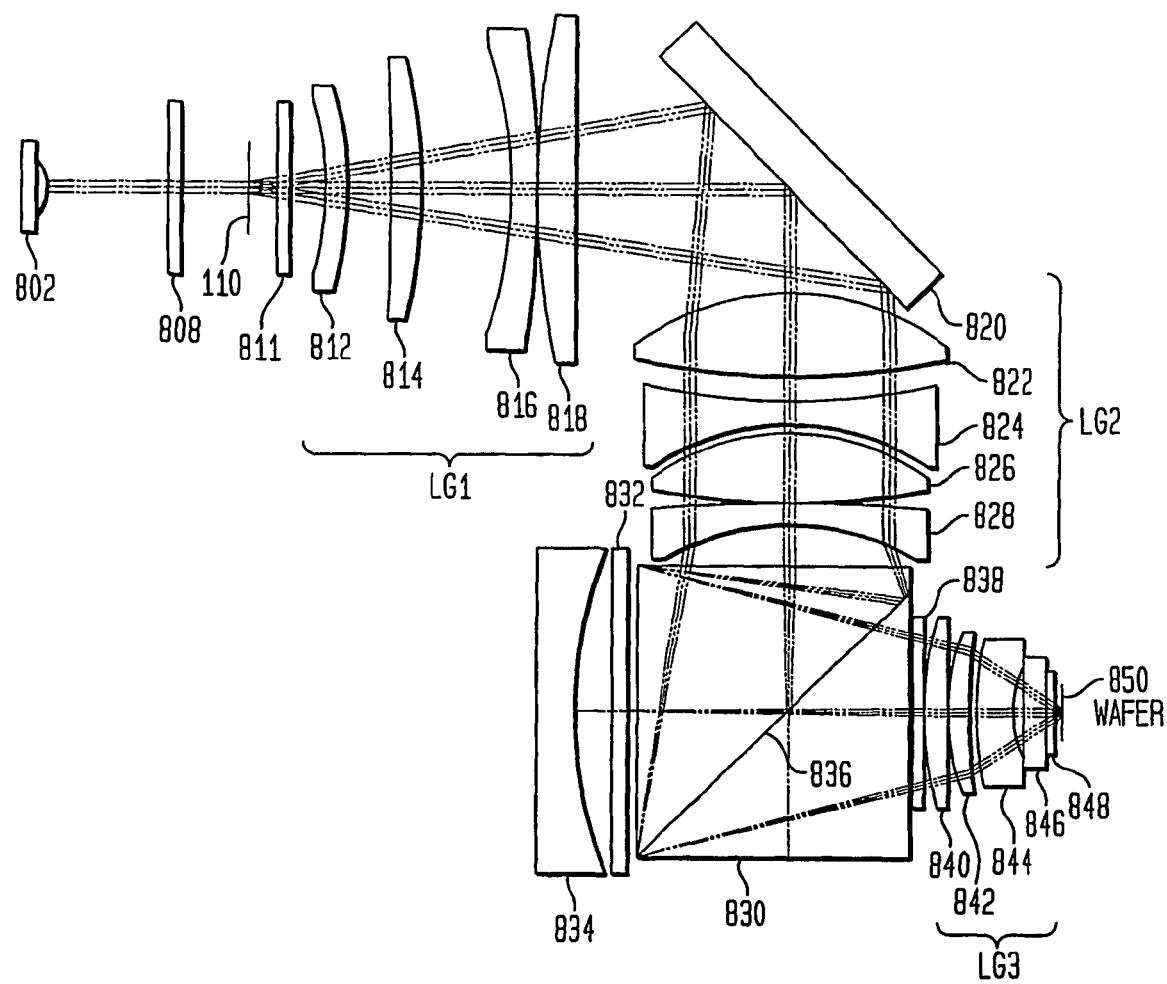
FIG. 8 is another embodiment of the present invention.

FIG. 8 illustrates a fourth embodiment of the optical reduction system of the present invention. This embodiment has a numerical aperture of 0.63 and can operate at a spectral bandwidth of 300 picometers, and preferably of 100 picometers, centered on 248.4 nanometers. From the long conju gate end, it includes a first quarter-wave plate 808, an object or reticle plane 110, a second quarter-wave plate 811, a first lens group LG1, a folding mirror 820, a second lens group LG2, a beamsplitter cube 830, a first quarter-wave plate 832, a concave mirror 834, a second quarter-wave plate 838, and a third lens group LG3. The image is formed at the image or wafer plane 180.

folding mirror 820 of FIG. 8 is not essential to the operation of the invention, but nevertheless permits the object 110 and image plane 180 to be parallel to each other which is convenient for the manufacture of semiconductor devices using photolithography.

The construction data of the fourth embodiment illustrated in FIG. 8 is given in Table 4 below.

TABLE 4

| Element Number | Radius of Curvature (mm) Front | Back | Thickness (mm) | Aperture Diameter (mm) Front | Back | Glass |
|---|---|---|---|---|---|---|
| 808 | Infinite | Infinite | 4.5000 | 122.0000 | 122.0000 | Silica |
| Space | | | 2.0000 | | | |
| 110 | | Infinite | 63.3853 | | | |
| Space | | | 2.0000 | | | |
| 811 | Infinite | Infinite | 4.5000 | 122.0000 | 122.0000 | Silica |
| 812 | −183.5661 | −215.7867CX | 17.0000 | 122.8436 | 130.6579 | Silica |
| Space | | | 46.6205 | | | |
| 814 | −601.1535CC | −230.9702CX | 21.4839 | 149.1476 | 153.3103 | Silica |
| Space | | | 68.8075 | | | |
| 816 | −195.1255 | −345.4510CX | 15.0000 | 161.6789 | 170.1025 | Silica |
| Space | | | 3.0000 | | | |
| 818 | 435.8058CX | −1045.1785CX | 24.9351 | 177.4250 | 178.2672 | Silica |
| Space | | | 130.0000 | | | |
| | | Decenter(1) | | | | |
| 820 | | Infinite | −64.5000 | 180.3457 | | Reflection |
| 822 | −210.7910CX | 380.1625CX | −43.1418 | 181.6672 | 178.0170 | Silica |
| Space | | | −15.8065 | | | |
| 824 | 300.1724CC | −123.4555CC | −12.0000 | 166.7278 | 152.3101 | Silica |
| Space | | | −3.8871 | | | |
| 826 | −126.8915CX | 972.6391CX | −41.3263 | 154.8530 | 151.8327 | Silica |
| Space | | | −1.5000 | | | |
| 828 | −626.4905CX | −116.6456CC | −12.0000 | 147.6711 | 136.1163 | Silica |
| Space | | | −31.8384 | | | |
| 830 | Infinite | Infinite | −74.0000 | 137.2448 | 200.1127 | Silica |
| | | Decenter(2) | | | | |
| 836 | | Infinite | | 200.1128 | | Reflection |
| 830 | Infinite | Infinite | 74.0000 | 200.1127 | 200.1127 | Silica |
| Space | | | 2.0000 | | | |
| 832 | Infinite | Infinite | 6.0000 | 148.6188 | 149.0707 | Silica |
| Space | | | 14.4638 | | | |
| Stop | | | | 149.6392 | | |
| 834 | | Aspheric | −14.4638 | 149.6392 | | Reflection |
| 832 | Infinite | Infinite | −6.0000 | 144.8563 | 141.2737 | Silica |
| Space | | | −2.0000 | | | |
| 830 | Infinite | Infinite | −74.000 | 139.3606 | 117.3979 | Silica |
| | | Decenter(3) | | | | |
| 830 | Infinite | Infinite | −61.000 | 117.3979 | 100.5074 | Silica |
| Space | | | −2.0000 | | | |
| 838 | Infinite | Infinite | −4.5000 | 99.6617 | 98.4157 | Silica |
| Space | | | −1.2000 | | | |
| 840 | −157.8776CX | 2282.2178CX | −13.7501 | 94.8267 | 91.8775 | Silica |
| Space | | | −1.2000 | | | |
| 842 | −94.0059CX | −46.6659CC | −13.4850 | 82.8663 | 78.1418 | Silica |
| Space | | | −1.2000 | | | |
| 844 | −147.2485CX | −77.8924CC | −22.2075 | 72.7262 | 50.6555 | Silica |
| Space | | | −3.2091 | | | |
| 846 | −159.2880CX | −519.4850CC | −13.8321 | 49.5648 | 39.0473 | Silica |
| Space | | | −0.2000 | | | |
| 848 | −129.3683CX | −426.7350CC | −6.1500 | 37.3816 | 32.4880 | Silica |
| Space | | Image Distance = | −4.0000 | | | |
| 850 | Image | Infinite | | | | |

The first lens group LG1 comprises a shell 812, a spaced doublet including a positive lens 814 and a negative lens 816, and a positive lens 818. The second lens group LG2 comprises a positive lens 822, a spaced doublet including a negative lens 824 and a positive lens 826, and a negative lens 828. The third lens group LG3 comprises two positive lenses 840 and 842, a shell 844, and two positive lenses 846 and 848. Again, as in the embodiment illustrated in FIG. 5, the The constants for the aspheric mirror 834 used in the equation located after Table 1 are as follows:
CURV=−0.00332614
K=0.000000
A=−4.32261E−10
B=3.50228E−14
C=7.13264E−19
D=2.73587E−22

This fourth embodiment is optimized for radiation centered on 248.4 nm. The single refracting material of fused silica and the large portion of refracting power restricts the spectral bandwidth of the embodiment depicted in FIG. 8. However, because the fourth embodiment has a maximum numerical aperture of 0.63 rather than of 0.7 as in the first three embodiments, the fourth embodiment provides acceptable imaging over a spectral full-width-half-maximum bandwidth of 300 picometers, or preferably of 100 picometers. Thus, in the former, an unnarrowed, or, in the latter, a narrowed excimer laser can be employed for the illumination source.

The fourth embodiment differs from the first three embodiments in that the net power of LG1 and LG2 of the fourth embodiment is weakly positive rather than weakly negative as in the first three embodiments. In addition, this illustrates that the overall focal power of LG1 plus LG2 can be either positive or negative and still permit an infinitely distant entrance pupil to be imaged at or near the concave mirror 834.

Figure 9:
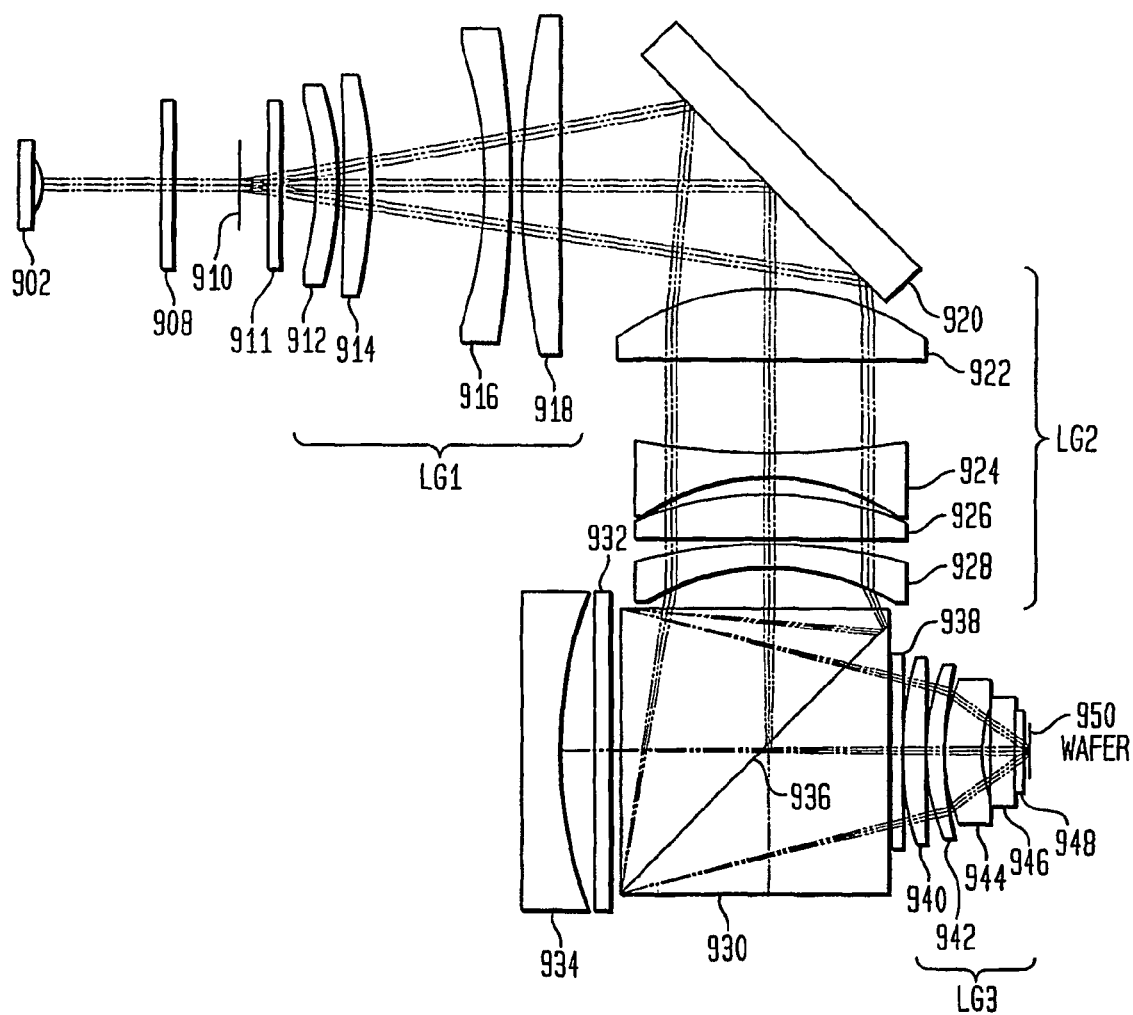
FIG. 9 is yet a further embodiment of the present invention.

FIG. 9 illustrates a fifth embodiment of the optical reduction system of the present invention. Preferably, this embodiment has a numerical aperture of 0.60 and operates at a spectral bandwidth of 300 picometers centered on 248.4 nanometers. From the long conjugate end, it includes a first quarter-wave plate 908, an object or reticle plane 110, a second quarter-wave plate 911, a first lens group LG1, a folding mirror 920, a second lens group LG2, a beamsplitter cube 930, a third quarter-wave plate 932, a concave mirror 934, a fourth quarter-wave plate 938, and a third lens group LG3. The image is formed at an image or wafer plane 180.

The first lens group LG1 comprises a shell 912, a spaced doublet including a positive lens 914 and a negative lens 916, and a positive lens 918. The second lens group LG2 comprises a positive lens 922, a spaced doublet including a negative lens 924 and a positive lens 926, and a negative lens 928. The third lens group LG3 comprises two positive lenses 940 and 942, a shell 944, and two positive lenses 946 and 948. Again, as in the embodiment illustrated in FIG. 5, the folding mirror 920 of FIG. 9 is not essential to the operation of the invention, but nevertheless permits the object and image planes to be parallel to each other which is convenient for the manufacture of semiconductor devices using photolithography.

The construction data of the fifth embodiment illustrated in FIG. 9 is given in Table 5 below.

TABLE 5

| Element Number | Radius of Curvature (mm) Front | Back | Thickness (mm) | Aperture Diameter (mm) Front | Back | Glass |
|---|---|---|---|---|---|---|
| 908 | Infinite | Infinite | −4.4550 | 120.0000 | 120.0000 | Silica |
| Space | | | 1.1880 | | | |
| 910 | | Infinite | 62.7514 | | | |
| Space | | | 1.1880 | | | |
| 911 | Infinite | Infinite | −4.4550 | 120.0000 | 120.0000 | Silica |
| 912 | −136.1154 CC | −152.5295 CX | 16.8300 | 120.7552 | 129.4354 | Silica |
| Space | | | 4.5206 | | | |
| 914 | −270.1396CC | −191.8742 CX | 20.5341 | 132.9152 | 139.0377 | Silica |
| Space | | | 90.8476 | | | |
| 916 | −188.9000CC | −284.7476CX | 17.5000 | 156.1938 | 165.6567 | Silica |
| Space | | | 2.9700 | | | |
| 918 | 433.8174 CX | −841.5599CX | 25.8293 | 173.8279 | 174.8334 | Silica |
| Space | | | 149.4549 | | | |
| | | Decenter(1) | | | | |
| 920 | | Infinite | −61.0000 | 177.2183 | | Reflection |
| 922 | −190.3251CX | −8413.4836CC | −34.4584 | 178.5071 | 174.2260 | Silica |
| Space | | | −51.5487 | | | |
| 924 | 690.5706CC | −146.4997CC | −11.8800 | 150.4109 | 141.8021 | Silica |
| Space | | | −10.6267 | | | |
| 526 | −265.9886CX | 1773.5314CX | −24.1851 | 142.1851 | 141.2400 | Silica |
| Space | | | −1.5000 | | | |
| 928 | −244.9899CX | −142.8558CC | −11.8800 | 139.3290 | 133.8967 | Silica |
| Space | | | −21.6411 | | | |
| 930 | Infinite | Infinite | −71.2800 | 134.3115 | 189.7826 | Silica |
| | | Decenter(2) | | | | |
| 936 | | Infinite | | 189.7826 | | Reflection |
| 930 | Infinite | Infinite | 71.2800 | 189.7826 | 189.7826 | Silica |
| Space | | | 1.9800 | | | |
| 932 | Infinite | Infinite | 5.9400 | 142.3429 | 142.6707 | Silica |
| Space | | | 18.5263 | | | |
| Stop | | | | 143.5034 | | |
| 934 | | Aspheric | −18.5263 | 143.5034 | | Reflection |
| 932 | Infinite | Infinite | −5.9400 | 134.2788 | 130.9398 | Silica |
| Space | | | −1.9800 | | | |
| 930 | Infinite | Infinite | −71.2800 | 130.1221 | 111.7247 | Silica |
| | | Decenter (3) | | | | |
| 930 | Infinite | Infinite | −60.4000 | 111.7247 | 96.1353 | Silica |
| Space | | | −1.9800 | | | |
| 938 | Infinite | Infinite | −4.4550 | 95.3562 | 94.2064 | Silica |
| Space | | | −1.1880 | | | |
| 940 | −127.4561CX | −1398.8019CC | −13.0104 | 90.4737 | 87.7002 | Silica |
| Space | | | −1.1880 | | | |

TABLE 5-continued

| Element Number | Radius of Curvature (mm) | | Thickness (mm) | Aperture Diameter (mm) | | Glass |
|---|---|---|---|---|---|---|
| | Front | Back | | Front | Back | |
| 942 | −98.8795CX | −424.1302CC | −12.2874 | 80.7016 | 76.3270 | Silica |
| Space | | | −1.1880 | | | |
| 944 | −132.0104CX | −70.9574CC | −17.8706 | 71.0789 | 53.4306 | Silica |
| Space | | | −3.1246 | | | |
| 946 | −123.1071CX | −585.4471CC | −19.9496 | 52.6417 | 38.2256 | Silica |
| Space | | | −0.1980 | | | |
| 948 | −137.8349CX | −292.6179CX | −6.0885 | 36.7251 | 31.8484 | Silica |
| Space | Image Distance = | | −4.0000 | | | |
| 950 | Image | Infinite | | 26.5000 | | |

The constants for the aspheric mirror 934 used in the equation located after Table 1 are as follows:

CURV=−0.00325995
K=0.000000
A=−6.91799E−10
B=5.26952E−15
C=6.10046E−19
D=1.59429E−22

This fifth embodiment is optimized for radiation centered on 248.4 nm. The single refracting material of fused silica and the large portion of refracting power restricts the spectral bandwidth of the embodiment depicted in FIG. 9. However, because the fifth embodiment has a maximum numerical aperture of 0.6 rather than of 0.7 as in the first three embodiments, the fifth embodiment provides acceptable imaging over a spectral full-width-half-maximum bandwidth of 300 picometers. Thus, an unnarrowed excimer laser can be employed for an illumination source. The fifth embodiment differs from the first three embodiments in that the net power of LG1 and LG2 of the fifth embodiment is weakly positive rather than weakly negative as in the first three embodiments. In addition, this illustrates that the overall focal power of LG1 plus LG2 can be either positive or negative and still permit an infinitely distant entrance pupil to be imaged at or near the concave mirror 934.

IV. Alternate Implementation

It is apparent to one skilled in the relevant art that the use of the first quarter-wave plate in any of the above embodiments depends on the initial polarization of the radiation incident on the long conjugate end. Therefore, if the polarization of the light is circular or unpolarized prior to the long conjugate end, then the first quarter-wave plate, used to transform linearly polarized light into circularly polarized light, could be omitted.

Such an implementation can be shown by omitting first quarter-wave plate 305 from FIG. 3 and/or first quarter-wave plate 405 from FIG. 4. Further implementations of this configuration in the other embodiments described above are obvious to one skilled in the relevant art.

CONCLUSION

While specific embodiments of the present invention have been described above, it should be understood that they have been presented by way of example only, and not limitation. It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A method for producing a lithography beam, comprising:
    generating an exposure beam;
    polarizing the exposure beam to produce a circularly polarized exposure beam; and
    illuminating a reticle with the circularly polarized exposure beam to produce an output beam having feature details of the reticle.

2. The method of claim 1, further comprising:
    exposing a wafer with the output beam.

3. The method of claim 1, wherein the polarizing step includes passing the exposure beam through a quarter-wave plate.

4. The method of claim 1, further comprising:
    polarizing the output beam to produce a linearly polarized output beam.

5. The method of claim 4, wherein the second polarizing step includes passing the exposure beam through a quarter-wave plate.

6. The method of claim 4, further comprising:
    exposing a wafer with the linearly polarized output beam.

7. The method of claim 1, further comprising:
    correcting aberrations in at least one aberration selected from the group of: astigmatism, field curvature, distortion, spherical aberration, and coma.

* * * * *